United States Patent
Gouchi et al.

(10) Patent No.: US 9,509,051 B2
(45) Date of Patent: Nov. 29, 2016

(54) ANTENNA DEVICE AND WIRELESS COMMUNICATION APPARATUS

(71) Applicant: Murata Manufacturing Co., Ltd., Nagaokakyo-shi, Kyoto-fu (JP)

(72) Inventors: Naoki Gouchi, Nagaokakyo (JP); Kuniaki Yosui, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 226 days.

(21) Appl. No.: 14/515,630

(22) Filed: Oct. 16, 2014

(65) Prior Publication Data

US 2015/0035718 A1    Feb. 5, 2015

Related U.S. Application Data

(63) Continuation of application No. PCT/JP2013/070844, filed on Aug. 1, 2013.

(30) Foreign Application Priority Data

| Aug. 9, 2012 | (JP) | 2012-176951 |
| Jun. 28, 2013 | (JP) | 2013-136251 |

(51) Int. Cl.
*H01Q 1/36* (2006.01)
*H01Q 7/06* (2006.01)
(Continued)

(52) U.S. Cl.
CPC ............... *H01Q 7/06* (2013.01); *H01Q 1/38* (2013.01); *H01Q 1/48* (2013.01); *H01Q 7/00* (2013.01);
(Continued)

(58) Field of Classification Search
CPC ............ H05K 2201/086; H05K 2201/096; H01Q 2201/10098; H01Q 1/48; H01Q 1/38; H01Q 7/00

USPC ................... 343/895, 702, 700 MS
See application file for complete search history.

(56) References Cited

U.S. PATENT DOCUMENTS

| 6,222,489 B1 * | 4/2001 | Tsuru | H01Q 1/362 |
| | | | 343/700 MS |
| 6,680,713 B2 * | 1/2004 | Yokoshima | H01Q 1/22 |
| | | | 343/700 MS |

(Continued)

FOREIGN PATENT DOCUMENTS

| GB | 2461443 A | 1/2010 |
| JP | 2003-218626 A | 7/2003 |

(Continued)

OTHER PUBLICATIONS

Official Communication issued in International Patent Application No. PCT/JP2013/070844, mailed on Oct. 15, 2013.

(Continued)

*Primary Examiner* — Hoanganh Le
(74) *Attorney, Agent, or Firm* — Keating & Bennett, LLP

(57) ABSTRACT

A plurality of first linear sections in a coil conductor are disposed on a lower surface of a first resin sheet. A plurality of second linear sections in the coil conductor are disposed on an upper surface of a second resin sheet. A plurality of via conductors in the coil conductor are disposed in the resin sheets. The coil conductor including the linear sections and the via conductors constitutes an antenna section. A first ground conductor is disposed on the lower surface of a third resin sheet. A second ground conductor is disposed on the upper surface of a fourth resin sheet. The first ground conductor and the second ground conductor are connected to each other by a interlayer connection conductor including a plurality of via conductors. The interlayer connection conductor does not define a closed loop surrounding the coil conductor.

20 Claims, 16 Drawing Sheets

(51) Int. Cl.
*H01Q 1/38* (2006.01)
*H05K 1/16* (2006.01)
*H01Q 1/48* (2006.01)
*H01Q 7/00* (2006.01)
*H05K 3/46* (2006.01)

(52) U.S. Cl.
CPC ............ *H05K 1/165* (2013.01); *H05K 3/4617* (2013.01); *H05K 2201/086* (2013.01); *H05K 2201/096* (2013.01); *H05K 2201/10098* (2013.01)

(56) References Cited

U.S. PATENT DOCUMENTS

| | | | |
|---|---|---|---|
| 9,225,064 B2* | 12/2015 | Gouchi | H01Q 7/06 |
| 2006/0151619 A1 | 7/2006 | Ninomiya et al. | |
| 2010/0225542 A1 | 9/2010 | Suzuki et al. | |
| 2010/0308118 A1 | 12/2010 | Kataya et al. | |
| 2012/0154252 A1* | 6/2012 | Nakatani | H01Q 7/00 343/895 |
| 2013/0181876 A1 | 7/2013 | Miura et al. | |

FOREIGN PATENT DOCUMENTS

| | | |
|---|---|---|
| JP | 3847292 B2 | 11/2006 |
| JP | 4183707 B2 | 11/2008 |
| JP | 2009-283771 A | 12/2009 |
| JP | 2010-206550 A | 9/2010 |
| JP | 4535209 B2 | 9/2010 |
| JP | 2010-263413 A | 11/2010 |
| JP | 2011-024146 A | 2/2011 |
| JP | 2011-239268 A | 11/2011 |
| WO | 2008/090745 A1 | 7/2008 |
| WO | 2008/133018 A1 | 11/2008 |
| WO | 2012/033031 A1 | 3/2012 |

OTHER PUBLICATIONS

Official Communication issued in Japanese Patent Application No. JP 2014-529456, mailed on Sep. 2, 2014.
Official Communication issued in corresponding Japanese Patent Application No. 2014-529456, mailed on Jan. 27, 2015.

* cited by examiner

ANTENNA DEVICE AND WIRELESS COMMUNICATION APPARATUS

BACKGROUND OF THE INVENTION

1. Field of the Invention

The present invention relates to an antenna device including a magnetic body and a coil conductor and also relates to a wireless communication apparatus including the antenna device.

2. Description of the Related Art

Recently, with a reduction in size and an increase in functionality of wireless communication equipment, including a mobile telephone terminal, the desire for functionality enhancement and size reduction of incorporated components has increased. One example method of building an antenna into a substrate and modularizing them using a process of producing a multilayer wiring substrate is proposed in Japanese Unexamined Patent Application Publication No. 2003-218626. With the antenna device having the structure illustrated in Japanese Unexamined Patent Application Publication No. 2003-218626, because the substrate is made of resin, the flexibility in shape is high, and it is relatively easy to incorporate components into the substrate.

However, with the miniaturization and high integration of a module, when another chip component or ground conductor is close to an incorporated antenna, undesired coupling is apt to occur. If the undesired coupling occurs, a problem arises in that it leads to degraded antenna characteristics.

SUMMARY OF THE INVENTION

Preferred embodiments of the present invention provide an antenna device that has good antenna characteristics while achieving high functionality and miniaturization, and also provide a wireless communication apparatus including the antenna device.

An antenna device according to a preferred embodiment of the present invention includes a multilayer substrate in which a plurality of dielectric or magnetic sheets are stacked, a coil conductor, a first ground conductor, a second ground conductor, and an interlayer connection conductor. The coil conductor has a coil winding axis perpendicular or substantially perpendicular to a stacking direction of the multilayer substrate, a first principal surface, a second principal surface, a first side surface parallel or substantially parallel to the coil winding axis, and a second side surface parallel or substantially parallel to the coil winding axis. The first ground conductor is opposite to the first principal surface and arranged outside the coil conductor. The second ground conductor is opposite to the second principal surface and arranged outside the coil conductor. The interlayer connection conductor electrically connect the first ground conductor and the second ground conductor to each other. The interlayer connection conductor is arranged only near or adjacent to the first side surface.

With this configuration, the antenna coil conductor incorporated in the multilayer substrate is not surrounded by a loop including the ground conductors and the interlayer connection conductor electrically connected thereto inside the multilayer substrate. Thus, a current in a direction opposed to a current flowing through the coil conductor does not flow into that loop, and a produced magnetic field is not cancelled out.

Optionally, at least one of the first ground conductor and the second ground conductor preferably includes a cut section near or adjacent to the second side surface. With this, the directivity is controlled.

Optionally, the multilayer substrate preferably is a multilayer body of resin sheets, and the antenna device preferably further includes a magnetic body arranged inside a coil defined by the coil conductor. With this, the coil antenna including the magnetic core disposed within the coil winding area is configured, and is miniaturized by the advantage of high magnetic permeability. In addition, because the sintered magnetic body is provided and the coil conductor is disposed in the dielectric section, low loss characteristics are obtainable.

Optionally, the antenna device preferably further includes an electronic component implemented on an upper surface of the multilayer substrate and electrically connected to the coil conductor. With this, the module including the antenna is configured.

Optionally, the antenna device preferably further includes electronic components mounted on an upper surface of the multilayer substrate, and the electronic components preferably are mounted in unevenly distributed locations other than a portion near or adjacent to the second side surface. With this, the directivity is controlled.

When the antenna device further include an electronic component mounted on an upper surface of the multilayer substrate, the electronic component preferably is mounted in a location that overlaps the coil conductor, the first ground conductor, or the second ground conductor as seen from the stacking direction of the sheets. With this, the flatness in the location where the electronic component is mounted is maintained, and this facilitates surface-mounting of the mounting component on the surface of the resin multilayer substrate. The occurrence of connection defects caused by deformation of the resin multilayer substrate are significantly reduced or prevented.

Optionally, the antenna device preferably further includes a coil (booster coil) electromagnetically coupled to the coil conductor and emitting an electromagnetic field. With this, the gain of the antenna is improved, and the directivity is controlled.

A wireless communication apparatus according to a preferred embodiment of the present invention includes an antenna device and a communication circuit. The antenna device includes a multilayer substrate in which a plurality of dielectric or magnetic sheets are stacked, a coil conductor, a first ground conductor, a second ground conductor, and an interlayer connection conductor. The coil conductor has a coil winding axis perpendicular or substantially perpendicular to a stacking direction of the multilayer substrate, a first principal surface, a second principal surface, a first side surface parallel or substantially parallel to the coil winding axis, and a second side surface parallel or substantially parallel to the coil winding axis. The first ground conductor is opposite to the first principal surface and arranged outside the coil conductor. The second ground conductor is opposite to the second principal surface and arranged outside the coil conductor. The interlayer connection conductor electrically connects the first ground conductor and the second ground conductor to each other only in a region near or adjacent to the first side surface. The communication circuit is connected to the coil conductor.

With this configuration, the wireless communication apparatus includes the antenna device having good antenna characteristics, obtain low loss characteristics, and have an increased maximum communication distance.

According to a preferred embodiment of the antenna device of the present invention, because the antenna coil conductor incorporated in the multilayer substrate is not surrounded by the loop including the ground conductors and the interlayer connection conductor electrically connected thereto inside the multilayer substrate, a magnetic field caused by the coil conductor is not cancelled out. As a result, the antenna device both being small and having high radiation efficiency is configured.

According to a preferred embodiment of the wireless communication apparatus of the present invention, its loss is significantly reduced, and the maximum communication distance is increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1A:
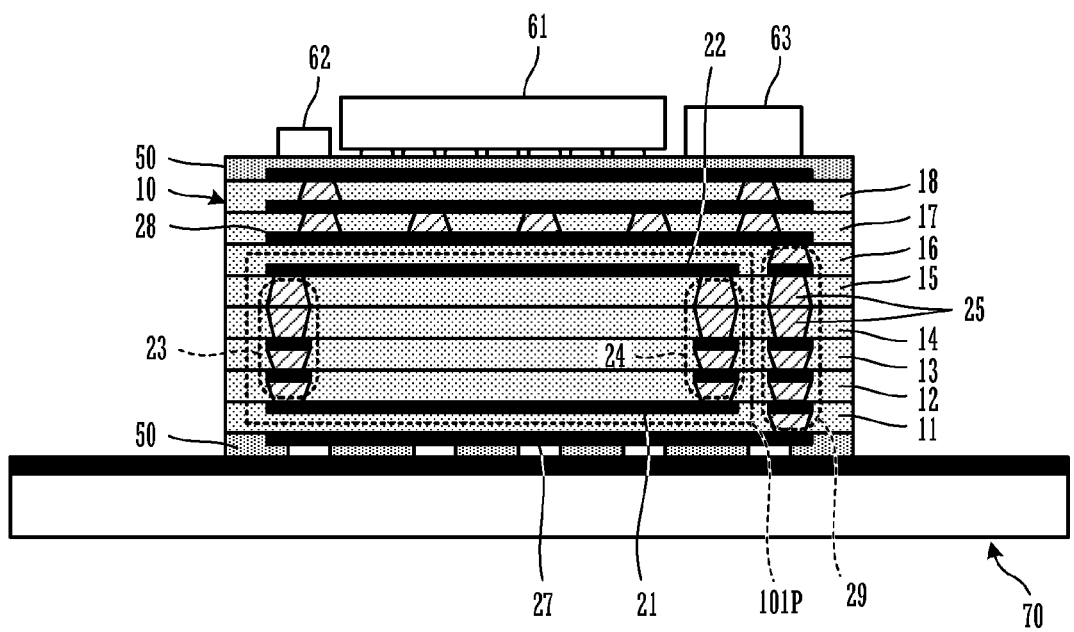
FIGS. 1A and 1B are cross-sectional views of a main portion of an antenna integrated RF module 201 according to a first preferred embodiment of the present invention.
Figure 1B:
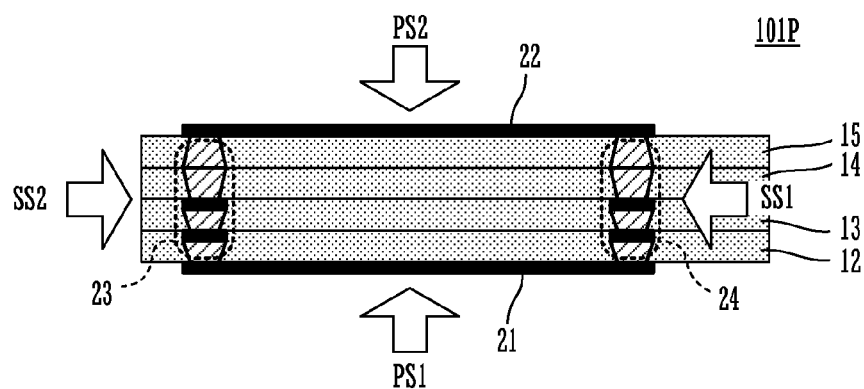
Figure 2:
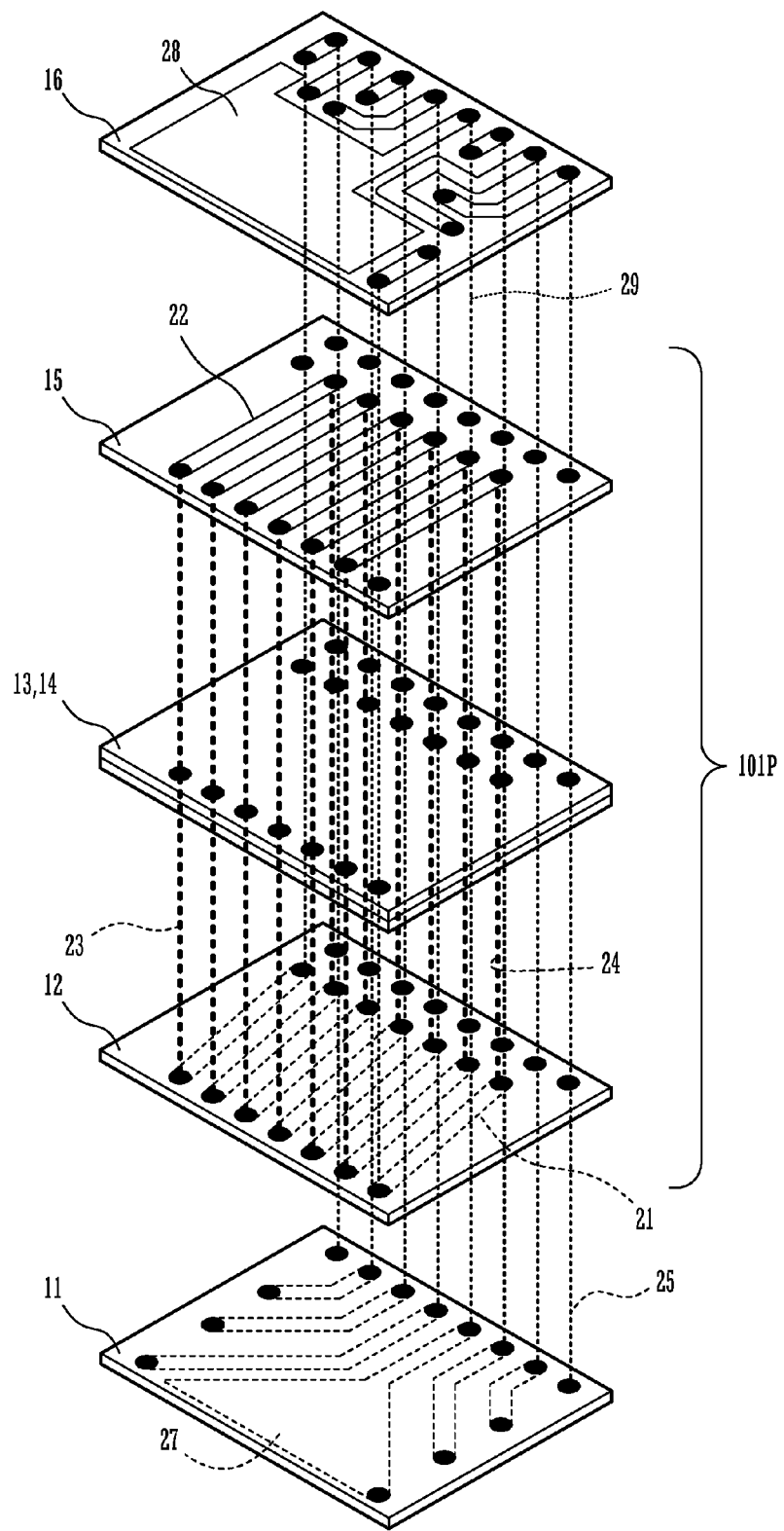
FIG. 2 is an exploded perspective view of several resin sheets in a resin multilayer substrate included in the antenna integrated RF module 201.

FIG. 1A is a cross-sectional view of a main portion of an antenna integrated RF module 201 according to a first preferred embodiment of the present invention, and FIG. 1B is a cross-sectional view that illustrates an antenna section 101P extracted therefrom. FIG. 2 is an exploded perspective view of several resin sheets in a resin multilayer substrate included in the antenna integrated RF module 201.

The antenna integrated RF module 201 includes a resin multilayer substrate 10 in which a plurality of resin sheets 11 to 18 are stacked and various electrodes disposed in the resin multilayer substrate 10. As illustrated in FIG. 2, a plurality of linear sections 21 in a coil conductor are disposed on the lower surface of the resin sheet 12. A plurality of linear sections 22 in the coil conductor are disposed on the upper surface of the resin sheet 15. A plurality of via conductors 23 and 24 in the coil conductor are disposed on the resin sheets 12 to 15. The resin sheets 13 and 14 preferably have the same basic configuration. The via conductors 23 connect first ends of the plurality of linear sections 21 and first ends of the plurality of linear sections 22. The via conductors 24 connect second ends of the plurality of linear sections 21 and second ends of the plurality of linear sections 22. That is, the coil conductor has a coil winding axis perpendicular or substantially perpendicular to the stacking direction of the multilayer substrate. The coil conductor having a helical shape preferably includes the linear sections 21 and 22 and the via conductors 23 and 24. This helical coil conductor includes a first principal surface PS1, a second principal surface PS2, a first side surface SS1 parallel or substantially parallel to the coil winding axis, and a second side surface SS2 parallel or substantially parallel to the coil winding axis and preferably has the shape extending along a horizontally positioned flat rectangular cylinder. This helical coil conductor constitutes the antenna section 101P.

An electrode and a solder resist 50 are disposed on the upper surface of the resin multilayer substrate 10, and mounting components 61, 62, and 63 and the like are mounted thereon. A terminal electrode and another solder resist 50 are disposed on the lower surface (implementing surface) of the resin multilayer substrate 10. Examples of the mounting components 61, 62, and 63 may include a radio frequency integrated circuit (RFIC), a chip capacitor, and a chip inductor.

A first ground conductor 27 and a terminal electrode opposite to the first principal surface PS1 are disposed on the lower surface of the resin sheet 11. A second ground conductor 28 and other electrode opposite to the second principal surface PS2 are disposed on the upper surface of the resin sheet 16. The first ground conductor 27 and the second ground conductor 28 are connected to each other with an interlayer connection conductor 29 including a plurality of via conductors 25. The interlayer connection conductor 29 extends in the vicinity of the coil conductor including the linear sections 21 and 22 and the via conductors 23 and 24. It is to be noted, however, that the interlayer connection conductor 29, the first ground conductor 27, and the second ground conductor 28 do not define a closed loop surrounding the coil conductor. That is, the interlayer connection conductor 29 is arranged only near or adjacent to the first side surface SS1. Thus, a magnetic field produced by the antenna section 101P, which is constituted of the coil conductor, is not cancelled out, and the antenna device both being small and having high radiation efficiency is configured.

Figure 16:
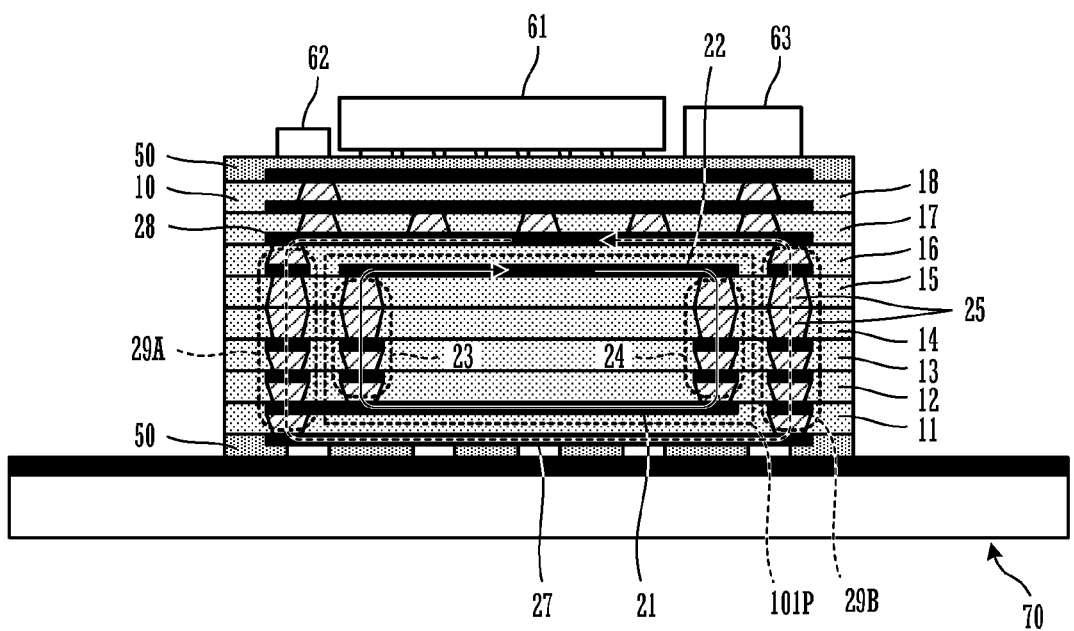
FIG. 16 is a cross-sectional view of an antenna integrated RF module as a comparative example.

An antenna integrated RF module as a comparative example is illustrated in a cross-sectional view in FIG. 16. The first ground conductor 27 and the second ground conductor 28 are connected to each other with interlayer connection conductors 29A and 29B composed of a plurality of via conductors. The interlayer connection conductors 29A and 29B, the first ground conductor 27, and the second ground conductor 28 constitute a closed loop surrounding the antenna section 101P. The other configuration is the same as that illustrated in FIGS. 1A and 1B. This antenna integrated RF module in the comparative example has low radiation efficiency because a current extending along a direction in which a magnetic field produced by the antenna section 101P, which is constituted of the coil conductor, is cancelled out flows into the closed loop.

The antenna integrated RF module 201 may be used as a near field communication (NFC) module, for example. When the antenna integrated RF module 201 is implemented on a target implementing substrate 70, a wireless communication apparatus having the near field communication function is configured.

Figure 3:
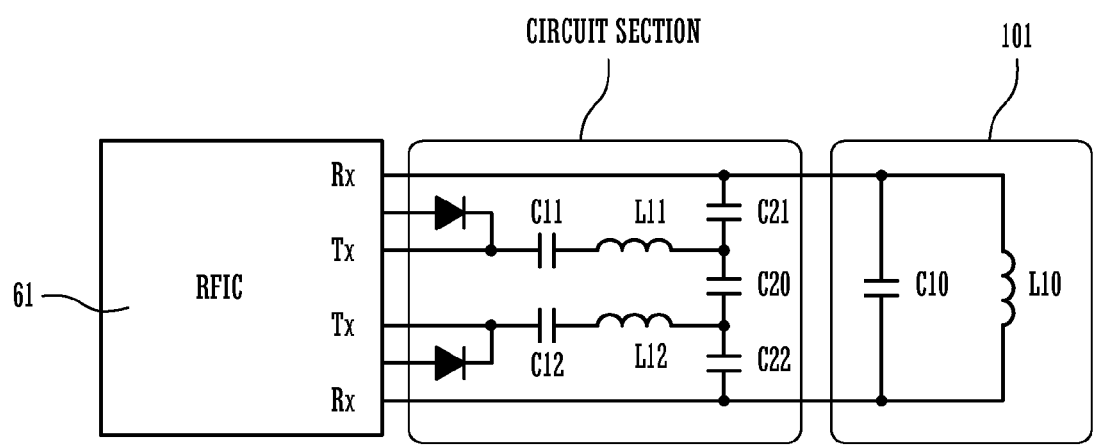
FIG. 3 is a circuit diagram of the antenna integrated RF module 201.

FIG. 3 is a circuit diagram of the antenna integrated RF module 201. In FIG. 3, an inductor L10 corresponds to the above-described helical coil conductor (an antenna coil). A capacitor C10 is an element used to define a resonant circuit with the inductor L10. The inductor L10 and the capacitor C10 constitute an antenna 101. Capacitors C21 and C22 are elements configured to adjust the degree of coupling between the RFIC 61 and the inductor L10. Inductors L11 and L12 and capacitors C11, C12, and C20 constitute a transmission filter. For example, when the communication circuit operates in a card mode, the RFIC 61 operates in a passive manner. Thus, the RFIC 61 generates a power supply voltage from a signal input into an RX terminal and reads a reception signal, and it performs load modulation on a circuit (load) connected to a TX terminal during transmission. For example, when the communication circuit operates in reader-writer mode, the RFIC 61 operates in an active manner. Thus, the RFIC 61 opens the RX terminal and transmits a transmission signal through the TX terminal during transmission, and it opens the TX terminal and receives a reception signal through the RX terminal during reception.

The module illustrated in FIG. 3 is merely an example, and the present invention is not limited thereto. For example, either one or each of the transmission terminal Tx and the reception terminal Rx of the RFIC 61 may be an unbalanced terminal.

Figure 4:
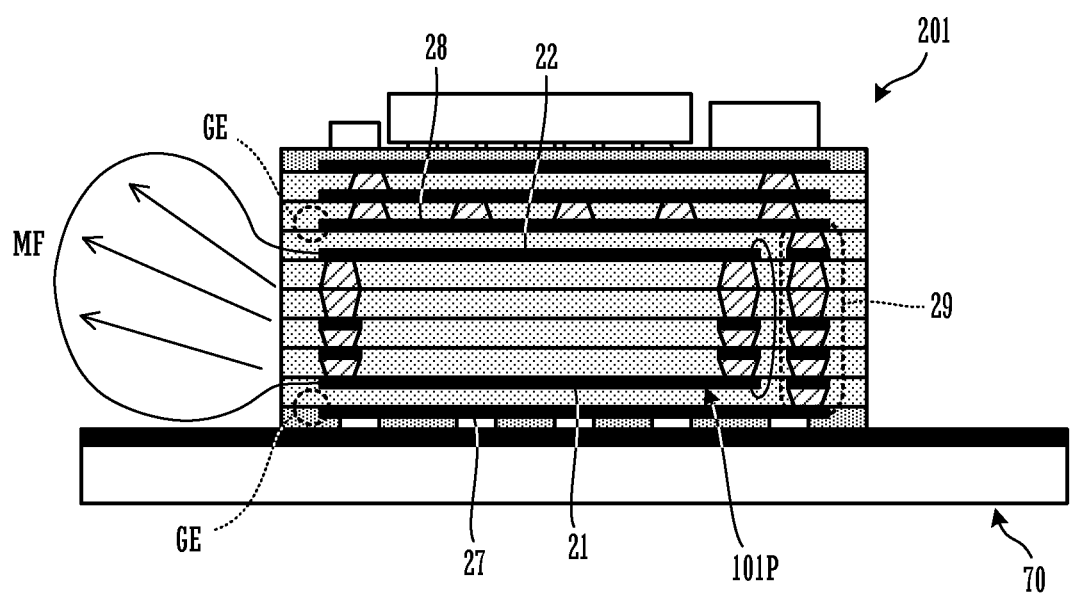
FIG. 4 is a concept diagram that illustrates how a magnetic field caused by an antenna section in the antenna integrated RF module 201 expands.

FIG. 4 is a concept diagram that illustrates how a magnetic field produced by the antenna section in the antenna integrated RF module 201 expands. Because the coil winding axis of the antenna section 101P is perpendicular or substantially perpendicular to the page, a magnetic flux passes through the winding axis, and a closed loop is defined and extends from one coil opening to the other coil opening. Because the ground conductors 27 and 28 are disposed on the top and bottom in the layer direction of the antenna section 101P, respectively, and the interlayer connection conductor 29 is disposed on one side portion, a magnetic field expands along directions in which it avoids them. The state where that magnetic field expands is indicated as MF in FIG. 4. Accordingly, sensitivity occurs in particularly in that directions in which the magnetic field expands. Because first ends of the linear sections 21 and 22 in the coil conductor are close to ends (edges) GE of the ground conductors 27 and 28, respectively, the magnetic field expands more by the action of a dielectric current flowing along the ends (edges) GE of the ground conductors 27 and 28. As a result, wide directivity is obtainable. The first ends of the linear sections 21 and 22 in the coil conductor may not necessarily be close to or adjacent to the ends (edges) GE of the ground conductors 27 and 28.

Second Preferred Embodiment

Figure 5:
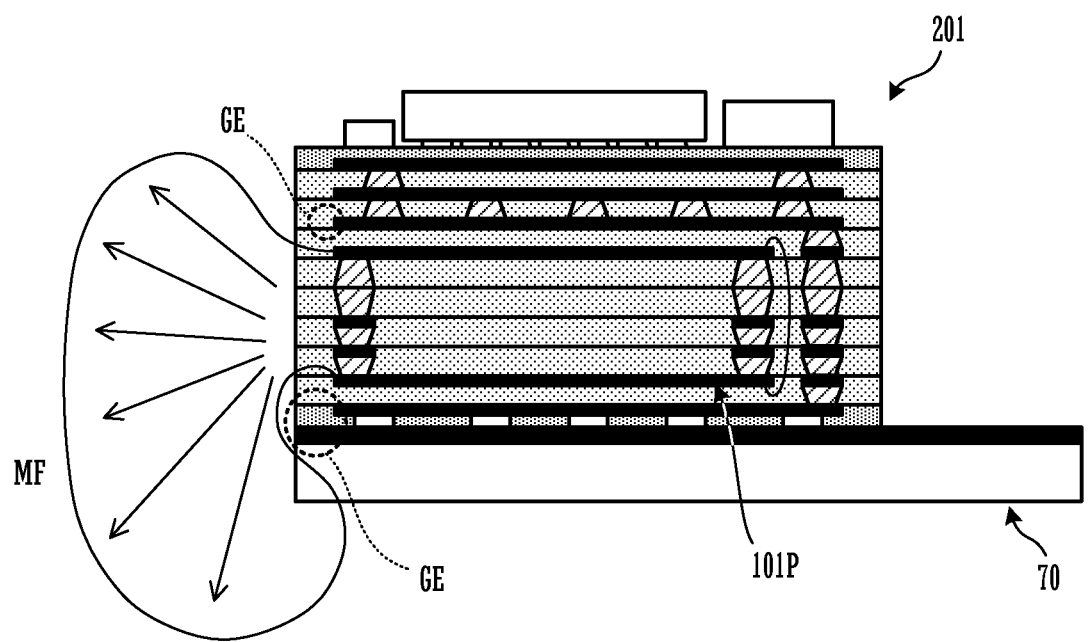
FIG. 5 illustrates how a magnetic field caused by the antenna section in the antenna integrated RF module 201 according to a second preferred embodiment of the present invention expands.

FIG. 5 illustrates how a magnetic field produced by the antenna section in the antenna integrated RF module 201 according to a second preferred embodiment of the present invention expands. In this example, the antenna integrated RF module 201 is arranged on an end of the implementing substrate 70. Because the ground conductor is disposed on substantially the entire surface of the implementing substrate 70, when the antenna integrated RF module 201 is implemented on the end of the implementing substrate 70, the antenna integrated RF module 201 is close to the end (edge) GE of the ground conductor on the implementing substrate 70. With this, the magnetic field more expands by the action of a dielectric current flowing along the end (edge) GE of each of the ground conductors 27 and 28 and the ground conductor on the implementing substrate 70. As a result, wider directivity is obtainable. Because the magnetic field is also present in the vicinity of the back surface of the implementing substrate, communications in the direction of the back surface of the implementing substrate are also enabled. The first ends of the linear sections 21 and 22 in the coil conductor may not necessarily be close to the ends (edges) GE of the ground conductors 27 and 28. Even in that case, a certain amount of the magnetic field is also present in the vicinity of the back side of the implementing substrate, and thus communications in the direction of the back surface of the implementing substrate are also enabled.

Third Preferred Embodiment

Figure 6:
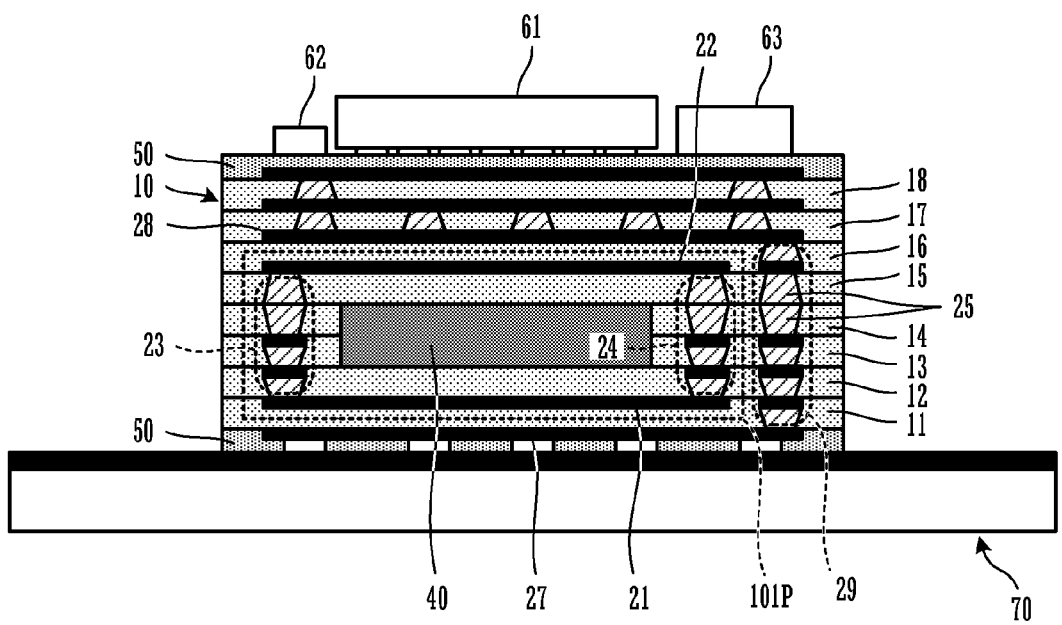
FIG. 6 is a cross-sectional view of a main portion of an antenna integrated RF module 203 according to a third preferred embodiment of the present invention.
Figure 7:
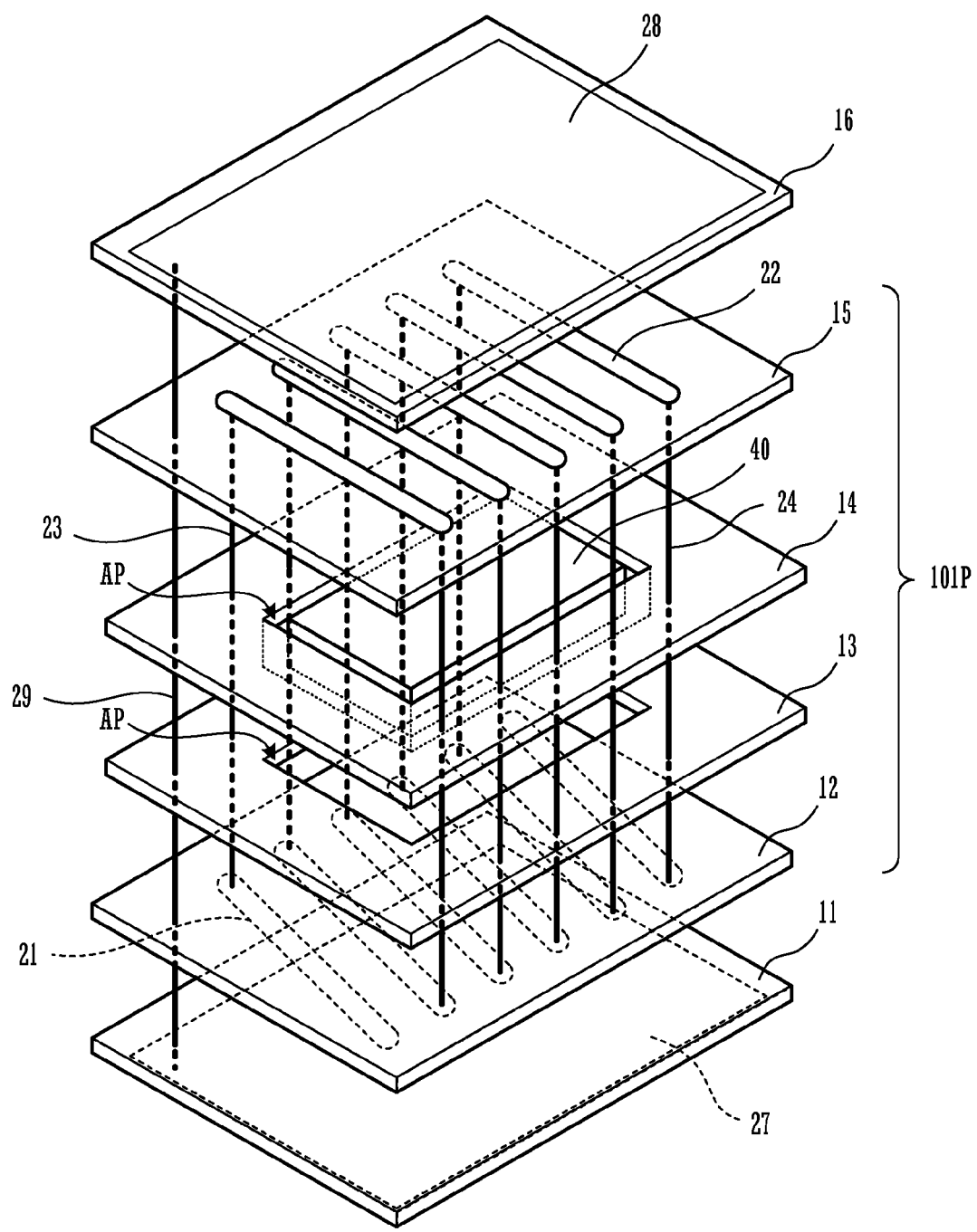
FIG. 7 is an exploded perspective view of a portion of the antenna integrated RF module 203.

FIG. 6 is a cross-sectional view of a main portion of an antenna integrated RF module 203 according to a third preferred embodiment of the present invention. FIG. 7 is an exploded perspective view of a portion of the antenna integrated RF module 203.

The antenna integrated RF module 203 includes the resin multilayer substrate 10 in which the plurality of resin sheets 11 to 18 are stacked and various electrodes and a magnetic core 40 disposed in the resin multilayer substrate 10. The antenna integrated RF module 203 differs from the antenna integrated RF module 201 illustrated in FIGS. 1A and 1B in that the magnetic core 40 is embedded in the resin multilayer substrate 10.

As illustrated in FIG. 7, each of the resin sheets 13 and 14 includes an aperture AP in its central portion. The stacked apertures AP define a cavity. The magnetic core 40 is embedded in this cavity. The magnetic core 40 is positioned inside the coil by the coil conductor including the linear sections 21 and 22 and the via conductors 23 and 24.

An example of the magnetic core 40 may be sintered magnetic ferrite having a rectangular or substantially rectangular parallelepiped shape. This configuration enables the module to be used as the coil antenna with the magnetic core.

Advantages described below are obtainable from the third preferred embodiment.

Because the coil conductor is not directly disposed on the surface of the magnetic body, a magnetic material having high magnetic permeability and, additionally, achieving low loss preferably is used in the magnetic core for the coil antenna.

Because a portion outside the coil conductor is dielectric (non-magnetic), good antenna characteristics are obtainable.

Because it is not necessary to co-firing the coil conductor, there is no need to use a material that can be sintered at high temperatures but has low conductivity, such as silver-palladium or tungsten.

Because the conductors preferably are formed by etching or the like, they can be formed with high dimensional accuracy, and stable electric characteristics are obtainable.

Because the via conductors 23 and 24 are arranged on two sides in an area where the coil conductor is located, the central portion in the coil conductor area tends to be thin. The arrangement of the magnetic core 40 in the central portion of the coil conductor area makes the thickness dimension uniform.

Fourth Preferred Embodiment

Figure 8:
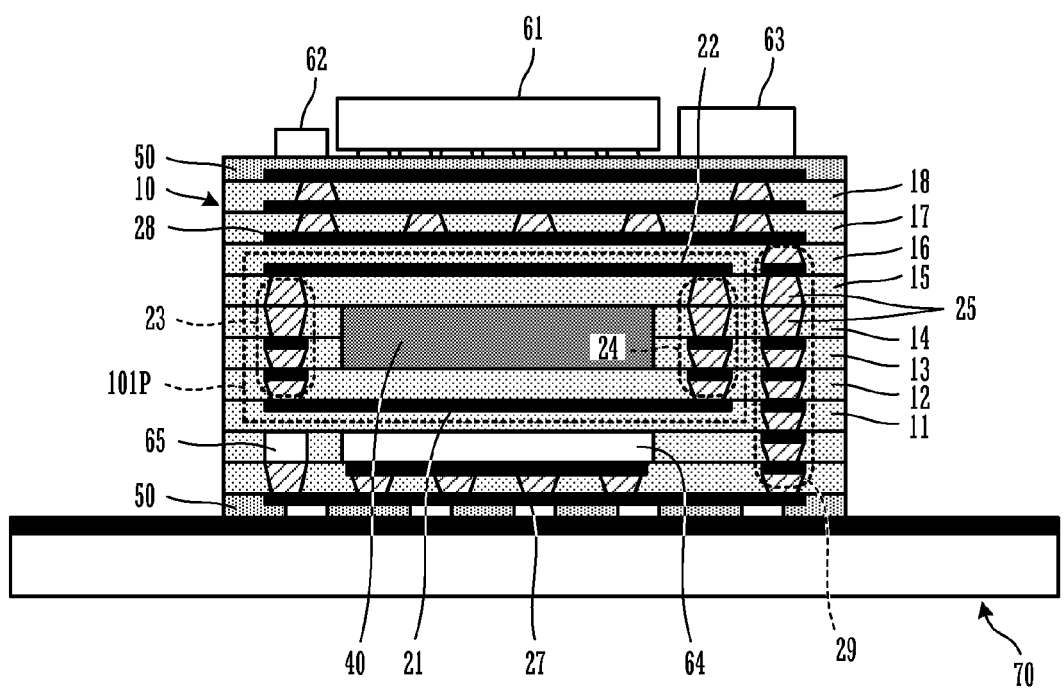
FIG. 8 is a cross-sectional view of a main portion of an antenna integrated RF module 204 according to a fourth preferred embodiment of the present invention.

FIG. 8 is a cross-sectional view of a main portion of an antenna integrated RF module 204 according to a fourth preferred embodiment of the present invention.

The antenna integrated RF module 204 includes the resin multilayer substrate 10 in which the plurality of resin sheets are stacked and various electrodes, the magnetic core 40, and internal components 64 and 65 disposed in the resin multilayer substrate 10. The antenna integrated RF module 204 differs from the antenna integrated RF module 203 illustrated in FIG. 6 in that the internal components 64 and 65 are embedded in the resin multilayer substrate 10. Examples of the internal components 64 and 65 may include an integrated circuit (IC) and a passive element.

In particular, as illustrated in FIG. 8, the internal components may be disposed below the antenna section (feeding coil) 101P.

With the structure in the present preferred embodiment, because an antenna at the other end of communication (of a reader-writer) is in a distant location above the front side of the substrate 70, the distance between the antenna section 101P and the antenna at the other end of communication (of the reader-writer) is reduced. A gap between the relatively large ground conductor on the implementing substrate 70 and the antenna section 101P is increased. Consequently, the antenna characteristics are improved.

Fifth Preferred Embodiment

Figure 9:
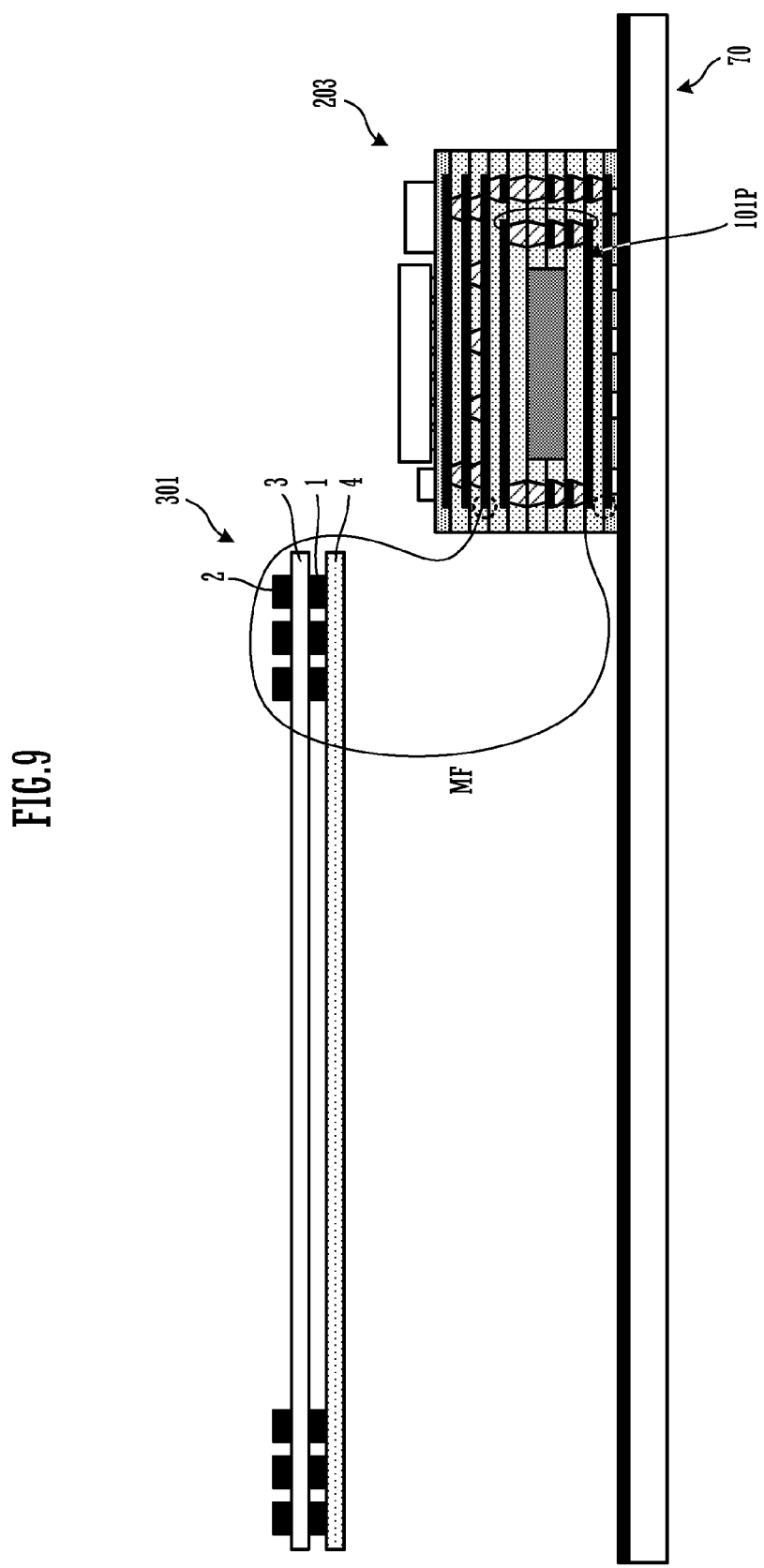
FIG. 9 is a cross-sectional view of a main portion of an antenna device according to a fifth preferred embodiment of the present invention.

FIG. 9 is a cross-sectional view of a main portion of an antenna device according to a fifth preferred embodiment of the present invention. In this example, the antenna device is not a simple antenna device but is the one configured together with the antenna integrated RF module 203 (that is, including the RF module). The antenna device includes the antenna integrated RF module 203 and a booster coil 301. The configuration of the antenna integrated RF module 203 is illustrated in the third preferred embodiment. The antenna section 101P in the antenna integrated RF module 203 preferably defines a feeding coil configured to feed power to the booster coil 301.

Figure 10:
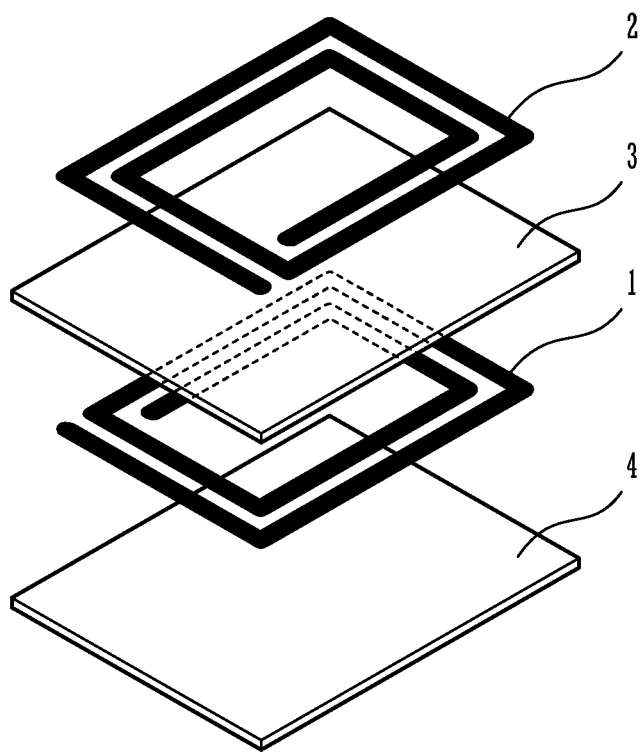
FIG. 10 is an exploded perspective view of a booster coil 301.

FIG. 10 is an exploded perspective view of the booster coil 301. The booster coil 301 includes an insulating base 3, a first coil 1 disposed on a first surface of the insulating base 3, a second coil 2 disposed on a second surface of the insulating base 3, and a magnetic sheet 4. Each of the first coil 1 and the second coil 2 is a patterned conductor preferably having a rectangular or substantially rectangular spiral shape, and they are patterned so as to be capacitively coupled to each other in a state where currents flow through them in the same direction in plan view. The two coil conductors are patterned such that when a current flows through one coil conductor in a clockwise direction in plan view from the same direction, a current also flows through the other coil conductor in the clockwise direction.

As illustrated as magnetic field expansion MF in FIG. 9 (MF does not indicate a magnetic line), the antenna section 101P in the antenna integrated RF module 203 and the booster coil 301 are arranged such that they are magnetic-field coupled to each other. The magnetic sheet 4 is thin such that it does not obstruct the magnetic-field coupling between the antenna section 101P in the antenna integrated RF module 203 and the booster coil 301. The magnetic sheet 4 shields a magnetic field produced by the booster coil 301 and suppresses the occurrence of eddy currents in the ground conductor disposed on the implementing substrate 70.

Figure 11:
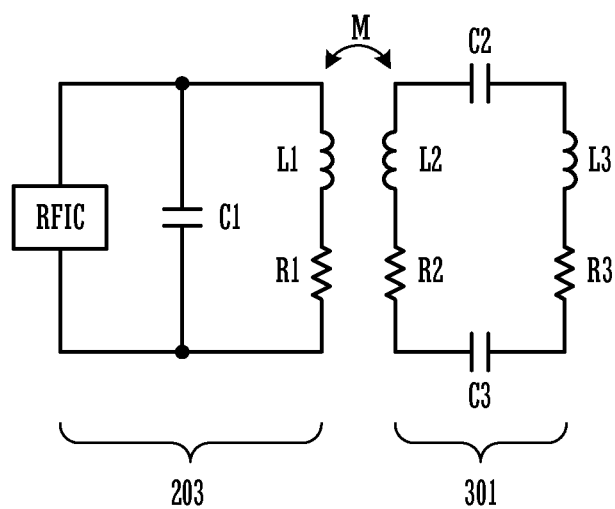
FIG. 11 is an equivalent circuit diagram of an antenna device illustrated in FIG. 9.

FIG. 11 is an equivalent circuit diagram of the antenna device illustrated in FIG. 9. The antenna integrated RF module 203 includes an inductance component L1 of the coil conductor and the magnetic core 40 (see FIG. 6) in the antenna section 101P, a resistance component R1 in the antenna section 101P, a capacitor C1, an RFIC, and the like. The capacitor C1 is a capacitance configured to adjust a resonant frequency of the antenna section (feeding coil) 101P. The booster coil 301 includes inductance components L2 and L3 of the first coil 1 and the second coil 2, capacitance components C2 and C3 occurring between the first coil 1 and the second coil 2, resistance components R2 and R3 of the first coil 1 and the second coil 2, and the like.

In such a manner, the antenna section 101P disposed in the resin multilayer substrate 10 preferably is configured to be used as a feeding coil device, and the booster coil 301, which is an element separated from the resin multilayer substrate 10, preferably is configured to be used as a booster antenna. This configuration increases the maximum communication distance.

Sixth Preferred Embodiment

Figure 12A:
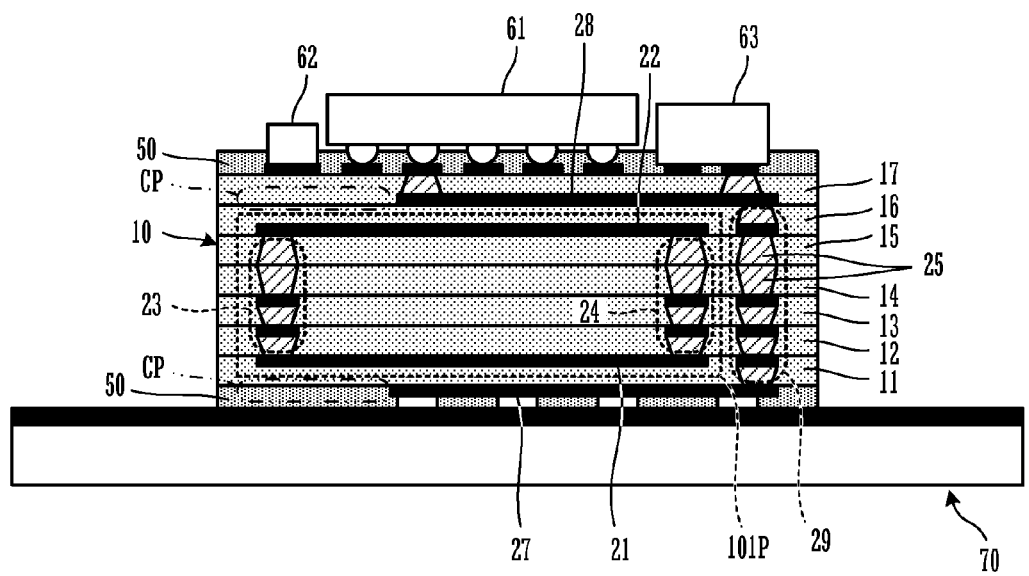
FIG. 12A is a cross-sectional view of a main portion of an antenna integrated RF module 206 according to a sixth preferred embodiment of the present invention.
Figure 12B:
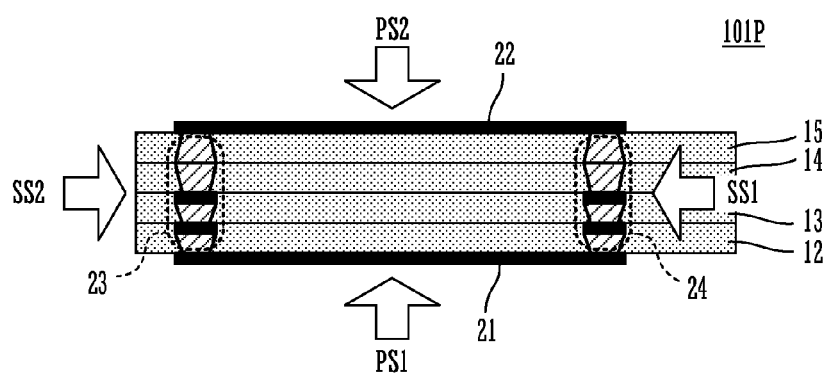
FIG. 12B is a cross-sectional view that illustrates an antenna section 101P extracted therefrom.
Figure 13:
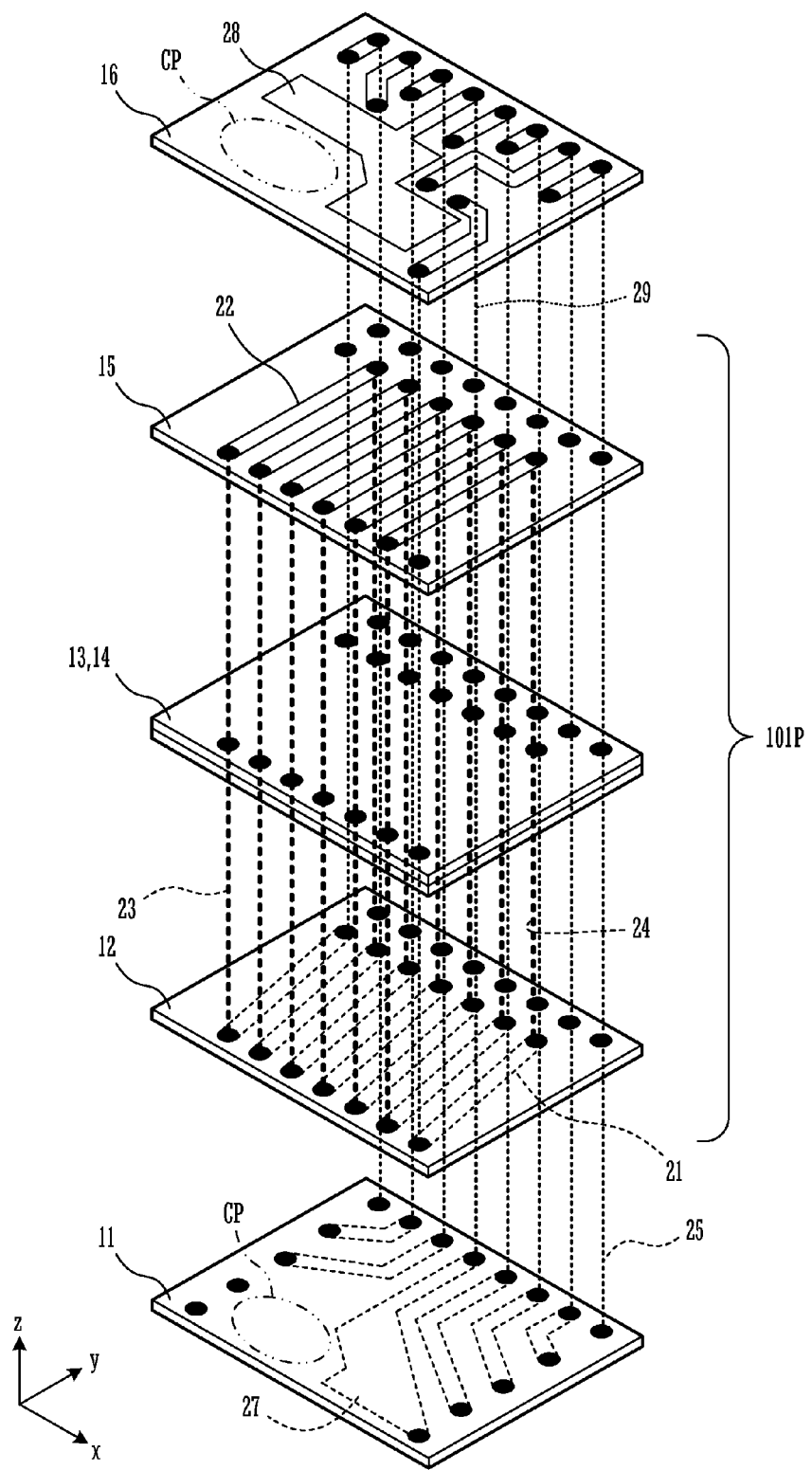
FIG. 13 is an exploded perspective view of several resin sheets in a resin multilayer substrate included in the antenna integrated RF module according to the sixth preferred embodiment of the present invention.

FIG. 12A is a cross-sectional view of a main portion of an antenna integrated RF module 206 according to a sixth preferred embodiment of the present invention, and FIG. 12B is a cross-sectional view that illustrates an antenna section 101P extracted therefrom. FIG. 13 is an exploded perspective view of several resin sheets in a resin multilayer substrate included in the antenna integrated RF module.

The antenna integrated RF module 206 includes the resin multilayer substrate 10 in which the plurality of resin sheets 11 to 17 are stacked and various electrodes disposed in the resin multilayer substrate 10. As illustrated in FIG. 13, the plurality of linear sections 21 in the coil conductor are disposed on the lower surface of the resin sheet 12. The plurality of linear sections 22 in the coil conductor are disposed on the upper surface of the resin sheet 15. The plurality of via conductors 23 and 24 in the coil conductor are disposed on the resin sheets 12 to 15. The resin sheets 13 and 14 preferably have the same basic configuration. The via conductors 23 connect the first ends of the plurality of linear sections 21 and the first ends of the plurality of linear sections 22. The via conductors 24 connect the second ends of the plurality of linear sections 21 and the second ends of the plurality of linear sections 22. This structure constitutes the antenna section 101P including the coil conductor preferably having a helical shape. The basic configuration of the antenna section 101P is preferably the same as the antenna section 101P illustrated in FIG. 2.

The electrode and the solder resist 50 are disposed on the upper surface of the resin multilayer substrate 10, and the mounting components 61, 62, and 63 and the like are mounted thereon. The terminal electrode and another solder resist 50 are disposed on the lower surface (implementing surface) of the resin multilayer substrate 10. Examples of the mounting components 61, 62, and 63 may include an RFIC, a chip capacitor, and a chip inductor.

The first ground conductor 27 and the terminal electrode opposite to the first principal surface PS1 are disposed on the lower surface of the resin sheet 11. The second ground conductor 28 and other electrode opposite to the second principal surface PS2 are disposed on the upper surface of the resin sheet 16. The first ground conductor 27 and the second ground conductor 28 are connected to each other with the interlayer connection conductor 29 including the plurality of via conductors 25. The interlayer connection conductor 29, the first ground conductor 27, and the second ground conductor 28 do not define a closed loop surrounding the coil conductor. That is, the interlayer connection conductor 29 is arranged only near or adjacent to the first side surface SS1.

As illustrated in FIGS. 12A and 13, each of the first ground conductor 27 and the second ground conductor 28 includes a cut section CP near or adjacent to the second side surface SS2. The presence of the cut sections CP is the most different from the example illustrated in FIG. 2. The other basic configuration is the same as that illustrated in FIG. 2.

In this manner, the presence of the cut sections CP in the first ground conductor 27 and the second ground conductor 28 near or adjacent to the second side surface enhances the directivity toward the second side surface SS2. Because the cut sections CP are present in the directions of (−x) and (−y) in the coordinate system illustrated in FIG. 13, the directivity (maximum gain direction in the xy plane) tilts toward the (−x) direction. That is, the directivity in the xy plane is controlled by the presence of the cut sections CP, in addition to the tilting of the directivity toward the (−y) direction in the yz plane caused by the absence of the interlayer connection conductor 29 near or adjacent to the second side surface SS2.

Either one of the first ground conductor 27 and the second ground conductor 28 may include the above-described cut section CP. Even if only one of them includes the cut section CP, the directivity can be controlled. For example, if the first ground conductor 27 includes the cut section CP, the directivity tilts toward the (−z) direction. If the second ground conductor 28 includes the cut section CP, the directivity tilts toward the z direction.

Seventh Preferred Embodiment

Figure 14:
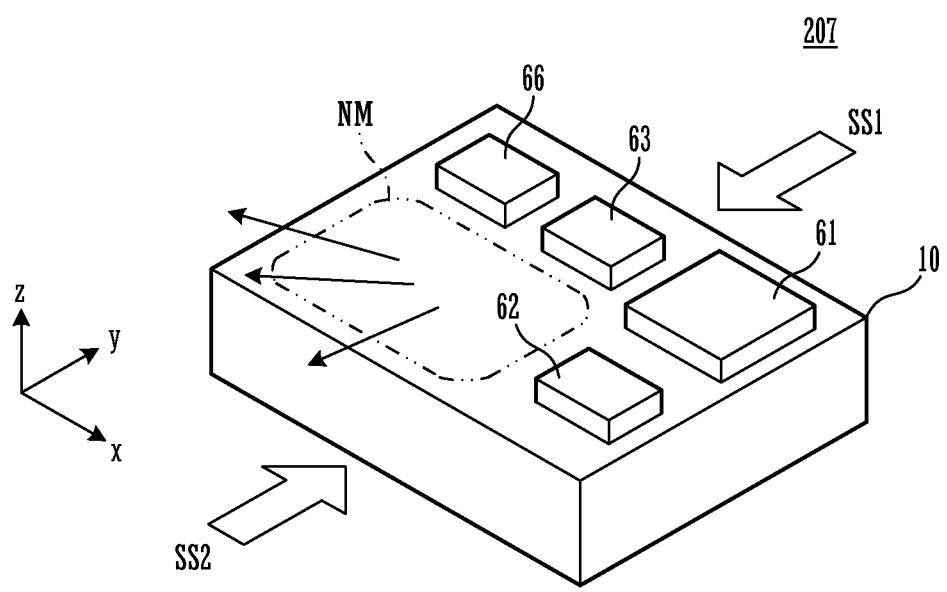
FIG. 14 is an external perspective view of an RF module 207 according to a seventh preferred embodiment of the present invention.

FIG. 14 is an exploded perspective view of an RF module 207 according to a seventh preferred embodiment of the present invention. The mounting components (electronic components, such as ICs and chip components) 61, 62, 63, and 66 are mounted on the upper surface of the resin multilayer substrate 10. The mounting components 61, 62, 63, and 66 are not arranged evenly on the resin multilayer substrate 10. The mounting components 61, 62, 63, and 66 are mounted in locations other than a non-mounting area NM in the resin multilayer substrate 10.

Terminal electrodes (lands) and wiring for implementation are concentrated in portions below the mounting components 61, 62, 63, and 66. Terminal electrodes and wiring are also concentrated on the lower surface and in the inner portion of each of the mounting components 61, 62, 63, and 66. In contrast, there is no concentration of metal sections in the non-mounting area NM. Thus, a magnetic field caused by the coil conductor inside the resin multilayer substrate 10 easily enters or exits from the non-mounting area NM. The arrowed lines in FIG. 14 indicate directions of a magnetic flux entering and exiting from the non-mounting area NM.

The presence of such a non-mounting area NM enables the directivity in the xy plane to be controllable.

The mounting components 61, 62, 63, and 66 may preferably be mounted in locations where the via conductors included in the coil conductor or ground conductors (for example, 24 and 25 illustrated in FIG. 13) are disposed (locations that overlap the via conductors in plan view). Such a region where the conductive patterns (in particular, via conductors) densely exist is hard and is not easily deformable, and the flatness of the RF module is maintained. This prevents suction errors and mis-registration during suction of the RF module by a vacuum suction chuck in a mounter. As a result, it facilitates the surface mounting of the RF module on the surface of the resin multilayer substrate. It also significantly reduces or minimizes the occurrence of connection defects caused by deformation of the resin multilayer substrate. Mounting the components in locations where the other via conductors (23 illustrated in FIG. 13) are disposed in the ground conductors (locations that overlap the via conductors in plan view) is also effective.

Eighth Preferred Embodiment

Figure 15:
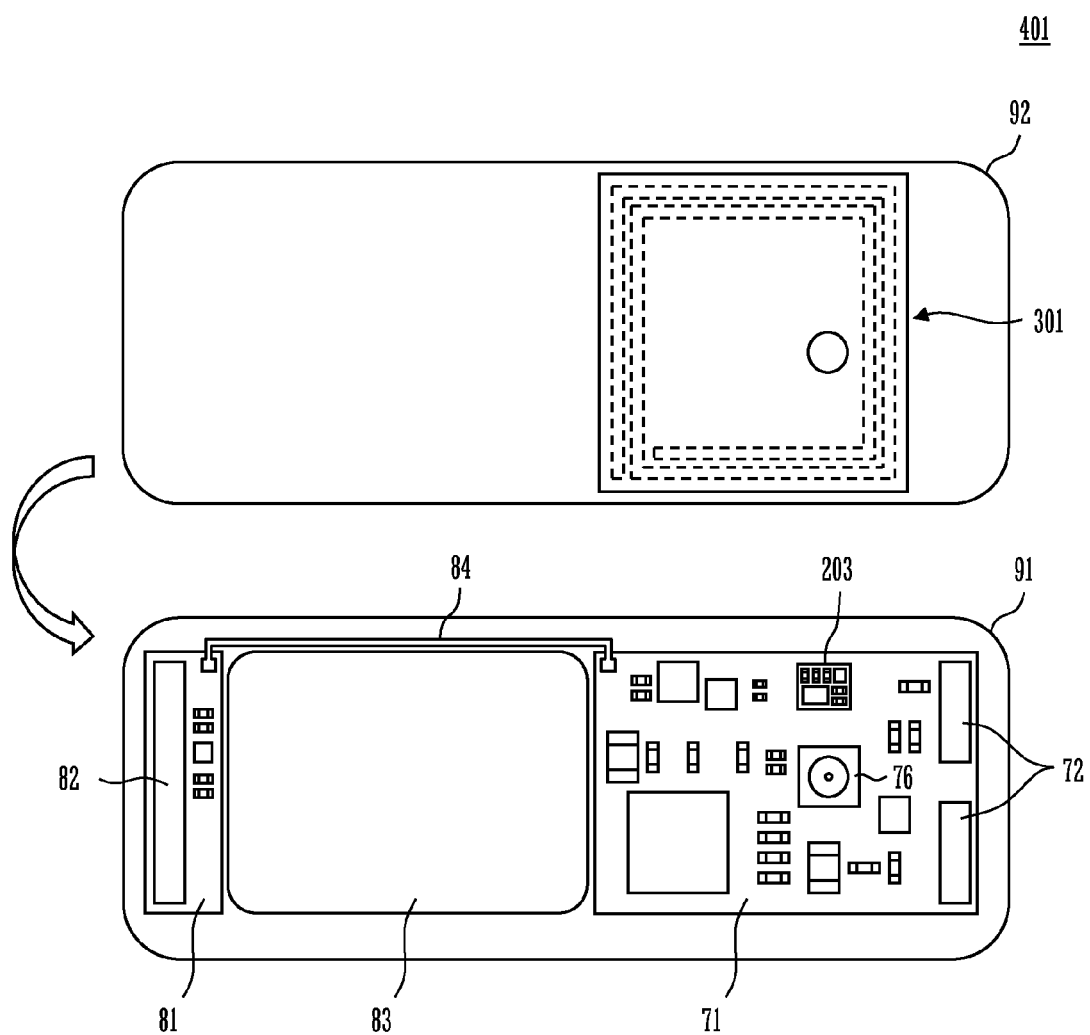
FIG. 15 illustrates a structure inside a housing of a wireless communication apparatus 401 according to an eighth preferred embodiment of the present invention and is a plan view thereof in a state where an upper housing 91 and a lower housing 92 are separated and its internal portion is exposed.

FIG. 15 illustrates a structure inside a housing of a wireless communication apparatus 401 according to an eighth preferred embodiment of the present invention and is a plan view thereof in a state where an upper housing 91 and a lower housing 92 are separated and its internal portion is exposed. The wireless communication apparatus 401 includes the antenna integrated RF module 203 and the booster coil 301 illustrated in FIG. 9.

Printed wiring boards 71 and 81, a battery pack 83, and the like are preferably disposed inside the upper housing 91. The antenna integrated RF module 203 is implemented on the printed wiring board 71. An ultrahigh frequency (UHF) antenna 72, a camera module 76, and the like are also mounted on the printed wiring board 71. A UHF antenna 82 and the like are mounted on the printed wiring board 81. The printed wiring boards 71 and 81 are connected to each other with a coaxial cable 84.

The booster coil 301 is disposed on the inner surface of the lower housing 92. The booster coil 301 is magnetic-field coupled to the antenna section (feeding coil) in the antenna integrated RF module 203.

The above-described examples use dielectric (non-magnetic) resin sheets. Sheets that contain magnetic powder or dielectric powder, or both, may also be used.

In place of the resin sheets, green sheets made of a magnetic material, such as ferrite, may be used. The multilayer substrate may be produced by stacking the green sheets and sintering the stack.

The above-described non-limiting examples illustrate a radio-frequency identification (RFID) for a 13.56 MHz band. Various preferred embodiments of the present invention are also applicable to a system for the UHF band, which is used in wireless local area network (LAN) or the like, in addition to a system for the high-frequency (HF) band.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna device comprising:
 a multilayer substrate including a plurality of dielectric or magnetic sheets stacked on each other in a stacking direction;
 a coil conductor including a coil winding axis perpendicular or substantially perpendicular to the stacking direction, a first principal surface, a second principal surface, a first side surface parallel or substantially parallel to the coil winding axis, and a second side surface parallel or substantially parallel to the coil winding axis;
 a first ground conductor opposite to the first principal surface and arranged outside the coil conductor;
 a second ground conductor opposite to the second principal surface and arranged outside the coil conductor; and
 an interlayer connection conductor configured to electrically connect the first ground conductor and the second ground conductor to each other; wherein
 the interlayer connection conductor is arranged only near or adjacent to the first side surface.

2. The antenna device according to claim 1, wherein at least one of the first ground conductor and the second ground conductor includes a cut section near or adjacent to the second side surface.

3. The antenna device according to claim 1, wherein the multilayer substrate is a multilayer body including resin sheets, and the antenna device includes a magnetic body arranged inside a coil defined by the coil conductor.

4. The antenna device according to claim 1, further comprising an electronic component located on an upper surface of the multilayer substrate and electrically connected to the coil conductor.

5. The antenna device according to claim 1, further comprising electronic components mounted on an upper surface of the multilayer substrate, wherein the electronic components are mounted in unevenly distributed locations other than a portion near or adjacent to the second side surface.

6. The antenna device according to claim 1, further comprising an electronic component mounted on an upper surface of the multilayer substrate, wherein the electronic component is mounted in a location that overlaps the coil conductor, the first ground conductor, or the second ground conductor as seen from the stacking direction.

7. The antenna device according to claim 1, further comprising a coil electromagnetically coupled to the coil conductor and configured to emit an electromagnetic field.

8. The antenna device according to claim 1, wherein the interlayer connection conductor, the first ground conductor, and the second ground conductor do not define a closed loop surrounding the coil conductor.

9. An antenna integrated RF module comprising the antenna device according to claim 1.

10. The antenna integrated RF module according to claim 9, wherein the antenna integrated RF module is a near field communication module.

11. The antenna integrated RF module according to claim 9, further comprising an implementing substrate including an end on which the antenna device is mounted.

12. The antenna integrated RF module according to claim 11, further comprising a ground conductor disposed on substantially an entire surface of the implementing substrate.

13. The antenna device according to claim 1, wherein the multilayer substrate includes a magnetic core disposed therein.

14. The antenna device according to claim 1, wherein the multilayer substrate includes internal components including at least one of an integrated circuit and a passive electronic component disposed therein.

15. The antenna integrated RF module according to claim 9, further comprising a booster coil that is magnetic field coupled to the coil conductor.

16. The antenna integrated RF module according to claim 9, further comprising an implementing substrate including an end on which the antenna device is mounted.

17. A wireless communication apparatus comprising:
 an antenna device including:
  a multilayer substrate including a plurality of dielectric or magnetic sheets stacked on each other in a stacking direction;
  a coil conductor including a coil winding axis perpendicular or substantially perpendicular to the stacking direction, a first principal surface, a second principal surface, a first side surface parallel or substantially parallel to the coil winding axis, and a second side surface parallel or substantially parallel to the coil winding axis;
  a first ground conductor opposite to the first principal surface and arranged outside the coil conductor;
  a second ground conductor opposite to the second principal surface and arranged outside the coil conductor; and
  an interlayer connection conductor configured to electrically connect the first ground conductor and the second ground conductor to each other only in a region near or adjacent to the first side surface; and
 a communication circuit connected to the coil conductor.

18. The wireless communication apparatus according to claim 17, further comprising an upper housing and a lower housing containing the antenna device and a booster coil.

19. The wireless communication apparatus according to claim 17, further comprising an antenna integrated RF module including the antenna device.

20. The wireless communication apparatus according to claim 19, wherein the antenna integrated RF module is a near field communication module.

* * * * *